United States Patent
Strassburg et al.

(10) Patent No.: US 8,314,415 B2
(45) Date of Patent: Nov. 20, 2012

(54) RADIATION-EMITTING SEMICONDUCTOR BODY

(75) Inventors: Martin Strassburg, Tegernheim (DE); Lutz Hoeppel, Alteglofsheim (DE); Matthias Sabathil, Regensburg (DE); Matthias Peter, Alteglofsheim (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 303 days.

(21) Appl. No.: 12/668,386

(22) PCT Filed: Jun. 20, 2008

(86) PCT No.: PCT/DE2008/001039
§ 371 (c)(1),
(2), (4) Date: Apr. 5, 2010

(87) PCT Pub. No.: WO2009/006870
PCT Pub. Date: Jan. 15, 2009

(65) Prior Publication Data
US 2010/0207100 A1 Aug. 19, 2010

(30) Foreign Application Priority Data
Jul. 9, 2007 (DE) .......................... 10 2007 031 926

(51) Int. Cl.
*H01L 33/06* (2010.01)
*H01L 29/15* (2006.01)
(52) U.S. Cl. .................... 257/15; 257/97; 257/E33.008; 257/E33.011
(58) Field of Classification Search ............... 257/15, 257/16, 94–97
See application file for complete search history.

(56) References Cited

U.S. PATENT DOCUMENTS

| | | | |
|---|---|---|---|
| 6,515,308 | B1 | 2/2003 | Kneissl et al. |
| 6,515,313 | B1 | 2/2003 | Ibbetson et al. |
| 6,657,234 | B1 | 12/2003 | Tanizawa |
| 6,822,991 | B2 | 11/2004 | Collins, III et al. |
| 6,878,975 | B2 | 4/2005 | Hueschen |
| 6,958,497 | B2 | 10/2005 | Emerson et al. |
| 6,995,389 | B2 | 2/2006 | Kim et al. |
| 7,099,362 | B2 | 8/2006 | Kim |
| 7,166,869 | B2 | 1/2007 | Nakamura et al. |
| 7,166,874 | B2 | 1/2007 | Nakamura et al. |
| 7,312,474 | B2 | 12/2007 | Emerson et al. |
| 7,473,941 | B2 | 1/2009 | Robbins et al. |
| 2003/0006418 | A1 | 1/2003 | Emerson et al. |
| 2003/0151042 | A1* | 8/2003 | Hueschen ........................ 257/12 |
| 2003/0209771 | A1 | 11/2003 | Akulova et al. |
| 2004/0066816 | A1* | 4/2004 | Collins et al. ................... 372/44 |
| 2004/0079947 | A1 | 4/2004 | Lan et al. |
| 2004/0101012 | A1 | 5/2004 | Nakamura et al. |
| 2004/0135165 | A1* | 7/2004 | Linder et al. .................. 257/103 |

(Continued)

FOREIGN PATENT DOCUMENTS
DE 10 2004 050 891 A1 4/2006
(Continued)

*Primary Examiner* — Ha Tran T Nguyen
*Assistant Examiner* — Raj R Gupta
(74) *Attorney, Agent, or Firm* — Slater & Matsil, L.L.P.

(57) ABSTRACT

A radiation-emitting semiconductor body includes a contact layer and an active zone. The semiconductor body has a tunnel junction arranged between the contact layer and the active zone. The active zone has a multi-quantum well structure containing at least two active layers that emit electromagnetic radiation when an operating current is impressed into the semiconductor body.

14 Claims, 7 Drawing Sheets

U.S. PATENT DOCUMENTS

| | | |
|---|---|---|
| 2004/0183063 A1 | 9/2004 | Nakamura et al. |
| 2004/0256611 A1 | 12/2004 | Kim et al. |
| 2005/0045895 A1 | 3/2005 | Emerson et al. |
| 2005/0056824 A1* | 3/2005 | Bergmann et al. ............... 257/14 |
| 2005/0105576 A1 | 5/2005 | Kim |
| 2006/0002444 A1* | 1/2006 | Wang et al. ................... 372/50.1 |
| 2007/0034853 A1* | 2/2007 | Robbins et al. ................. 257/13 |
| 2008/0258133 A1 | 10/2008 | Seong |
| 2009/0090900 A1 | 4/2009 | Avramescu et al. |

FOREIGN PATENT DOCUMENTS

| | | |
|---|---|---|
| DE | 10 2005 035 722 A1 | 2/2007 |
| EP | 1 403 935 A2 | 3/2004 |
| EP | 1 489 708 A1 | 12/2004 |
| EP | 1 748 496 A2 | 1/2007 |
| EP | 1 755 173 A2 | 2/2007 |
| WO | WO-02/097904 A2 | 12/2002 |
| WO | WO-2007/049939 A1 | 5/2007 |

\* cited by examiner

RADIATION-EMITTING SEMICONDUCTOR BODY

This patent application is a national phase filing under section 371 of PCT/DE2008/001039, filed Jun. 20, 2008, which claims the priority of German patent application 10 2007 031 926.8, filed Jul. 9, 2007, each of which is incorporated herein by reference in its entirety.

TECHNICAL FIELD

The invention relates to a radiation-emitting semiconductor body.

BACKGROUND

Radiation-emitting semiconductor bodies of conventional design exhibit a saturation of the radiant power emitted during operation as the current density of an operating current impressed into the semiconductor body during operation increases, with the result that the efficiency decreases as the operating current density increases.

SUMMARY

In one aspect, the present invention specifies a radiation-emitting semiconductor body having an improved efficiency at high operating current densities.

A radiation-emitting semiconductor body according to the invention has an active zone. The active zone has a multi-quantum well structure containing two or more active layers which emit electromagnetic radiation when an operating current is impressed into the semiconductor body.

The active zone is based on a hexagonal compound semiconductor material, for example. In the present context, "based on a hexagonal compound semiconductor material" means that the active zone or at least one layer of the active zone, in particular, an active layer, comprises a hexagonal compound semiconductor material. That is to say that at least the active zone has a hexagonal lattice structure. The entire semiconductor body is preferably based on a hexagonal compound semiconductor material, and the semiconductor material of the semiconductor body then has a hexagonal lattice structure.

The hexagonal compound semiconductor material is, for example, semiconductor structures composed of binary, ternary and/or quaternary compounds of elements of main groups II and VI of the periodic system of chemical elements. By way of example, one of the following compounds can be involved: ZnO, ZnMgO, CdS, ZnCdS, MgBeO. Furthermore, the hexagonal compound semiconductor material can be a semiconductor structure composed of a binary, ternary and/or quaternary compound of elements of main groups III and V, for example, a nitride. By way of example, one of the following semiconductor structures can be involved: BN, AlGaN, GaN, AlInGaN.

In this case, the semiconductor material need not necessarily have a mathematically exact composition according to one of the above formulae; rather, it can have one or more dopants and also additional constituents. For the sake of simplicity, however, the above formulae only include the essential constituents of the crystal lattice, even if these can be replaced in part by smaller quantities of further substances.

In the case of a hexagonal compound semiconductor, for example, in the case of a semiconductor body based on the III-V semiconductor material system AlInGaN, that is to say $Al_xIn_yGa_{1-x-y}N$ where $0 \leq x \leq 1$, $0 \leq y \leq 1$ and $x+y \leq 1$—piezoelectric fields occur in the active zone, which can include InGaN quantum wells, for example, on account of the polar wurtzite crystal structure and the strain in the active zone.

The piezoelectric fields are oriented along the growth direction. The polarity of the fields is dependent on the growth mode in which the semiconductor body is grown. When using metal organic vapor phase epitaxy (MOVPE), for example, growth preferably takes place in the so-called Ga-face growth mode. For a GaN crystal, for example, this means that in the case of the Ga—N double layers from which the crystal is formed, the gallium atoms lie in the direction of that surface of the crystal which is remote from the growth substrate. In the case of crystals which are grown in the Ga-face growth mode and in which the growth direction runs parallel to the crystallographic c-axis, the crystallographic c-axis and the electric field point away from the substrate to the crystal surface.

The polarization of the piezoelectric fields on account of the strains in the active zone has the opposite direction. The lattice charges induced by the polarization are negative at that side of the active region which faces the crystal surface, and positive at that side of the active region which faces the interface between substrate and grown crystal. The polarity of the piezoelectric fields in the direction of the c-axis can be influenced only with difficulty in the Ga-face growth mode.

In one advantageous configuration of the optoelectronic semiconductor body, a p-doped confinement layer, the active zone and an n-conducting confinement layer succeed one another in this order in the growth direction, that is to say parallel to the crystallographic c-axis. The p-doped confinement layer and the n-conducting confinement layer are semiconductor layers of the semiconductor body which precede or succeed the active zone in the growth direction. In one development, the p-doped confinement layer and/or the n-conducting confinement layer constitute(s) a charge carrier confinement layer and/or a cladding layer. In particular, a cladding layer is provided, for instance on account of its refractive index, for guiding an electromagnetic radiation emitted by the active zone during operation in a manner known in principle to the person skilled in the art.

In the case of a sequence of layers around the active region in which the n-conducting confinement layer, the active zone and the p-doped confinement layer succeed one another in this order in the growth direction, the piezoelectric fields lead to an unfavorable energetic barrier structure which makes it more difficult for charge carriers to be injected into the active region. Therefore, such optoelectronic semiconductor bodies have an internal quantum efficiency which is often unsatisfactory and, in particular, falls greatly as the current density increases.

It is currently assumed by the inventors that, in comparison with such semiconductor bodies, the region in which a recombination of electrons and holes takes place during operation is advantageously widened if the p-doped confinement layer, the active zone and the n-conducting confinement layer succeed one another in this order in the growth direction. In the region in which a recombination of electrons and holes takes place during operation, that is to say in the recombination zone, at least two active layers of the multi-quantum well structure are arranged and emit electromagnetic radiation during operation of the semiconductor body.

In one expedient configuration, the semiconductor body has a contact layer. The contact layer is, in particular, a semiconductor layer of the semiconductor body through which an operating current is impressed into the active zone during operation of the semiconductor body. It preferably has a good electrical conductivity, in particular, a good electrical transverse conductivity. In one configuration, the contact layer is a semiconductor layer produced epitaxially on the growth substrate. As an alternative, the contact layer can also be contained in the growth substrate or be formed by the latter.

In one embodiment, the contact layer is a p-type contact layer arranged, in particular, between the growth substrate and the active zone. In this embodiment, the p-type contact layer, the p-doped confinement layer, the active zone, the n-conducting confinement layer and a further contact layer, which is an n-type contact layer, in particular, expediently succeed one another in the growth direction. In one embodiment, a p-doped semiconductor layer simultaneously constitutes the p-type contact layer and the p-doped confinement layer. Analogously, an n-conducting semiconductor layer can simultaneously constitute the n-type contact layer and the n-conducting confinement layer. In a further embodiment, the growth substrate and the p-type contact layer are formed in integrated fashion.

In another embodiment, the growth substrate is greatly thinned or completely removed from the semiconductor body. In this case, the growth direction can generally be determined on the basis of the sequence of atomic layers in the semiconductor body. If crystal growth was effected in the Ga-face growth mode, in the growth direction the distance from the Ga-plane to the N-plane is approximately three times as large as the distance from the N-plane to the Ga-plane. It is possible, in principle, to produce the materials in the N-face growth mode, that is to say to grow them in the opposite direction or order relative to the lattice structure. In this direction, the distance from the N-plane to the Ga-plane is approximately three times as large as the distance from the Ga-plane to the N-plane. However, special measures are generally necessary in order to grow the materials in the N-face growth mode.

In one alternative embodiment, the contact layer is an n-type contact layer. By way of example, the n-type contact layer is deposited on the growth substrate and precedes the active zone in the growth direction or the growth substrate has the n-type contact layer.

Between the n-type contact layer and the active zone, the semiconductor body in one expedient configuration has a tunnel junction. By means of the tunnel junction, a sequence of the semiconductor layers of the semiconductor body is advantageously obtained wherein, in the growth direction, that is to say parallel to the crystallographic c-axis, the p-doped confinement layer succeeds the n-type contact layer and precedes the active zone and the n-conducting confinement layer succeeds the active zone.

In one preferred configuration of the semiconductor body, a barrier layer is arranged between two active layers, in particular, between each two adjacent active layers. In one advantageous development, the barrier layer has a layer thickness of less than or equal to 9 nm; the layer thickness of the barrier layer is preferably 4 nm or less. Preferably, the active layers and the barrier layer(s) directly succeed one another. The quantum wells of the multi-quantum well structure are formed, in particular, by the active layers, the barrier layer(s) and the terminating barrier layers.

In a further configuration of the semiconductor body, the active zone has three or more active layers. In one development, it has five or fewer active layers.

The inventors have established that with such a barrier layer or such barrier layers, an arrangement of at least two of the active layers in the recombination zone is obtained. By way of example, three or more and, in particular, five or fewer active layers of the multi-quantum well structure are arranged in the recombination zone.

The inventors have furthermore established that by means of such a barrier layer or by means of such barrier layers having a layer thickness of 9 nm or less, and, in particular, of 4 nm or less, an electronic coupling between the individual active layers is obtained. It is currently assumed by the inventors that, for example, resonant tunneling of charge carriers between the individual active layers occurs in this way. This advantageously leads, particularly at high current densities of an operating current impressed into the semiconductor body during operation, to an advantageous charge carrier distribution among the individual active layers arranged in the recombination zone, with the result that a high efficiency is obtained.

In the case of a semiconductor body with a tunnel junction, the tunnel junction also influences the potential profile in the active zone. Firstly, the energetic barriers for injection into the active zone are lowered for the charge carriers. Secondly, the inventors have been able to show that the effective thickness of the quantum wells of the multi-quantum well structure is advantageously particularly small. By way of example, the effective thickness of the quantum wells is less than or equal to 1 nm.

To summarize, it has been established that the combination of an inverted polarity of the operating current relative to the growth direction with a multi-quantum well structure containing barrier layers having a small layer thickness makes a semiconductor body possible in which at least two and, in particular, at least three active layers of the multi-quantum well structure contribute to the radiation emission and which has a particularly high efficiency at high operating currents. The inverted polarity of the operating current relative to the growth direction is obtained by means of the tunnel junction, in particular.

In one advantageous configuration, the tunnel junction has at least one n-type tunnel junction layer and at least one p-type tunnel junction layer.

Preferably, an undoped region composed of at least one undoped interlayer is contained between the at least one n-type tunnel junction layer and the at least one p-type tunnel junction layer. In the tunnel junction, the n-type tunnel junction layers and the p-type tunnel junction layer in this configuration do not directly adjoin one another, therefore, but rather are separated from one another by the at least one undoped interlayer. In this case, the expression "tunnel junction layer" is used for differentiation from the remaining semiconductor layers of the semiconductor body and means that the n-type tunnel junction layer or p-type tunnel junction layer thus designated is arranged in the tunnel junction.

By means of the n-type tunnel junction layer and the p-type tunnel junction layer being separated from one another by the undoped region, a disadvantageous compensation of the different charge carriers at the interface is prevented, which would otherwise occur on account of the diffusion of charge carriers and/or dopants across the interface.

Although the insertion of the undoped region between the n-type tunnel junction layer and the p-type tunnel junction layer also produces a region having only a low charge carrier density within the tunnel junction, it has been established in connection with the present application that this region has a less disadvantageous effect on the electrical properties of the tunnel junction, in particular, on the forward voltage. In particular, the undoped region inserted in the form of one or more undoped interlayers has a less disadvantageous effect than a region at the interface between an n-type tunnel junction layer and a directly adjoining p-type tunnel junction layer in which charge carriers and/or dopants mutually compensate for one another on account of the diffusion across the interface. This is important for operation of the semiconductor body particularly when the latter is operated with an operating current that brings about a high current density in the semiconductor body.

In a further advantageous configuration, at least the following semiconductor layers succeed on another in the specified order in the growth direction: the n-type contact layer, the tunnel junction, wherein preferably the at least one p-type tunnel junction layer succeeds the undoped region and the latter succeeds the at least one n-type tunnel junction layer in the growth direction, a p-doped confinement layer, the active zone, and a further n-type contact layer.

In one development, the undoped region of the tunnel junction has at least two undoped interlayers having different compositions. By way of example, it has a GaN layer remote from the active zone and an AlGaN layer adjacent to the active zone.

The thickness of the undoped region is, for example, between 0.5 and 15 nm, in particular, between 1 and 10 nm, in each case inclusive of the limits. Given such a thickness, the undoped region constitutes a barrier for the charge carriers respectively present in the n-type tunnel junction layer and the p-type tunnel junction layer, which barrier prevents mutual compensation of the charges. On the other hand, the undoped region is still thin enough not to have a disadvantageous effect on the electronic properties of the tunnel junction.

In a further advantageous configuration, the n-type tunnel junction layer and/or the p-type tunnel junction layer contains a superlattice composed of alternating layers having different material compositions and/or dopant concentrations.

In another configuration, there is arranged between the p-doped layer and the active zone a diffusion barrier for the p-type dopant of the p-doped layer. In one development, the diffusion barrier contains a superlattice.

In a further configuration, the radiation-emitting semiconductor body contains an undoped semiconductor layer at that side of the active zone which is remote from the tunnel junction. By way of example, the undoped semiconductor layer constitutes an n-conducting confinement layer. The undoped semiconductor layer is expediently arranged between the active zone and a further contact layer of the semiconductor body.

The undoped semiconductor layer has a layer thickness of between 3 and 40 nm, for example. In contrast to conventional semiconductor bodies, the layer thickness of the undoped semiconductor layer does not influence, or only slightly influences, the efficiency of the semiconductor body. Therefore, the layer thickness can advantageously be chosen practically as desired and enables larger tolerances during the production of the semiconductor body.

In one advantageous configuration, the semiconductor body is provided for operation with an operating current density of greater than or equal to 100 $A/cm^2$, in particular, of greater than or equal to 300 $A/cm^2$. In one development, the semiconductor body is provided for operation with even higher operating current densities, for instance for operation with operating current densities of 500 $A/cm^2$ or more, of 1000 $A/cm^2$ or of 2000 $A/cm^2$ or more.

The semiconductor body, during operation, emits electromagnetic radiation with a spectral distribution having an intensity maximum. By way of example, the intensity maximum has a wavelength in the infrared, visible or ultraviolet spectral range. The full width at half maximum of the spectral distribution is substantially independent of the current intensity of the operating current. In accordance with the mathematical definition, the full width at half maximum is understood in the present case to mean the difference between the two wavelengths at which the intensity, proceeding from the wavelength of the intensity maximum to larger and to smaller wavelengths, has fallen to half of the intensity at the intensity maximum.

The semiconductor body can be a light emitting diode chip or a laser diode chip, in particular, an edge emitting laser diode chip.

In a further configuration, the semiconductor body contains at least one further active zone. In this configuration, the active zones succeed one another in the growth direction. By way of example, the semiconductor body contains between three and ten active zones. A further tunnel junction is expediently arranged between each two adjacent active zones. The further active zone(s) and/or the further tunnel junction/the further tunnel junctions are preferably embodied analogously to a configuration described above for the active zone or the tunnel junction.

By way of example, the semiconductor body contains the following semiconductor layers in the specified order: the p-doped confinement layer, the active zone, the n-conducting confinement layer, the further tunnel junction, a further p-doped confinement layer, the further active zone, a further n-conducting confinement layer. In one development, the tunnel junction precedes the p-doped confinement layer. In another development, the further n-type contact layer succeeds the further n-conducting confinement layer. A further diffusion barrier can be arranged between the further p-doped confinement layer and the further active zone.

BRIEF DESCRIPTION OF THE DRAWINGS

Further advantages and advantageous embodiments will become apparent from the following exemplary embodiments described in conjunction with FIGS. 1 to 11.

In the exemplary embodiments and figures, identical or identically acting constituent parts are provided with the same reference symbols. The figures, and, in particular, the size relationships of the individual elements illustrated in the figures, should not be regarded as true to scale. Rather, individual constituent parts, such as layers for instance, may be illustrated with an exaggerated size or thickness in order to enable better illustration and/or in order to afford better understanding.

DETAILED DESCRIPTION OF ILLUSTRATIVE EMBODIMENTS

Figure 1:
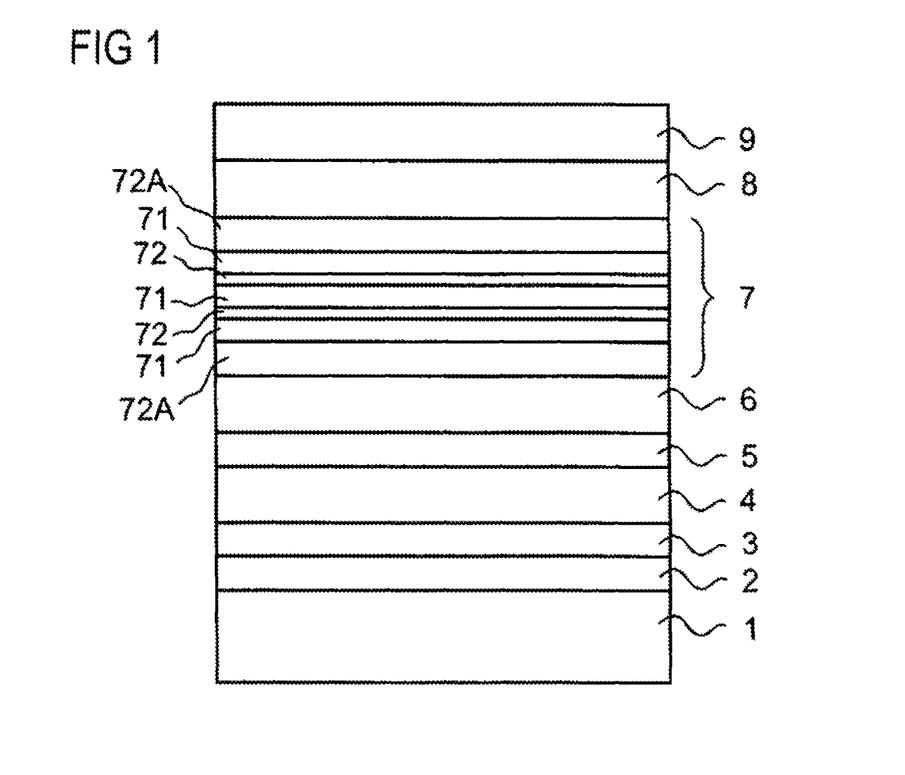
FIG. 1 shows a schematic cross section through a semiconductor body in accordance with one exemplary embodiment.

FIG. 1 shows an exemplary embodiment of a radiation-emitting semiconductor body. The semiconductor body has a semiconductor layer sequence, which is preferably based on a hexagonal compound semiconductor material, in particular on a nitride III compound semiconductor material. The nitride III compound semiconductor material is particularly preferably AlInGaN, that is to say $Al_xIn_yGa_{1-x-y}N$ where $0 \leq x \leq 1$, $0 \leq y \leq 1$ and $x+y \leq 1$.

The semiconductor body has a substrate 1, which, in particular, contains a material suitable for the growth of such a nitride III compound semiconductor material, for example, GaN, SiC and/or sapphire, or consists of the material. The substrate is preferably n-conducting and contains, for example, n-GaN, n-SiC and/or n-Si(111) or consists of at least one of these materials.

As shown in FIG. 1, a buffer layer 2 can be applied on the substrate 1, for example, in order to match the lattice parameters between the substrate 1 and the succeeding semiconductor layers. The buffer layer 2 consists, for example, of GaN or AlGaN, that is to say $Al_xGa_{1-x}N$ where $0 \leq x \leq 1$. In particular, it has a thickness of between 20 nm and 1500 nm, inclusive of the limits.

An n-type contact layer 3, for instance an n-conducting and, in particular, n-doped GaN layer, AlGaN layer or AlInGaN layer, is subsequently arranged onto the substrate 1 or, if appropriate, onto the buffer layer 2. In the present case, the n-type contact layer 3 is n-doped with Si in a concentration of between $10^{18}$ cm$^{-3}$ and $10^{20}$ cm$^{-3}$, in particular between $2 \times 10^{18}$ cm$^{-3}$ and $10^{19}$ cm$^{-3}$, in each case inclusive of the limits. A tunnel junction 4 succeeds the n-type contact layer 3.

Preferably, the tunnel junction 4 is a highly doped n-p tunnel junction. In the present case, a high doping is understood to mean a doping of greater than or equal to $10^{19}$ cm$^{-3}$, in particular, of greater than or equal to $10^{20}$ cm$^{-3}$. In this case, the n-doped side of the tunnel junction 4 faces the n-type contact layer 3 and the p-doped side is remote from the n-type contact layer 3.

Figure 2:
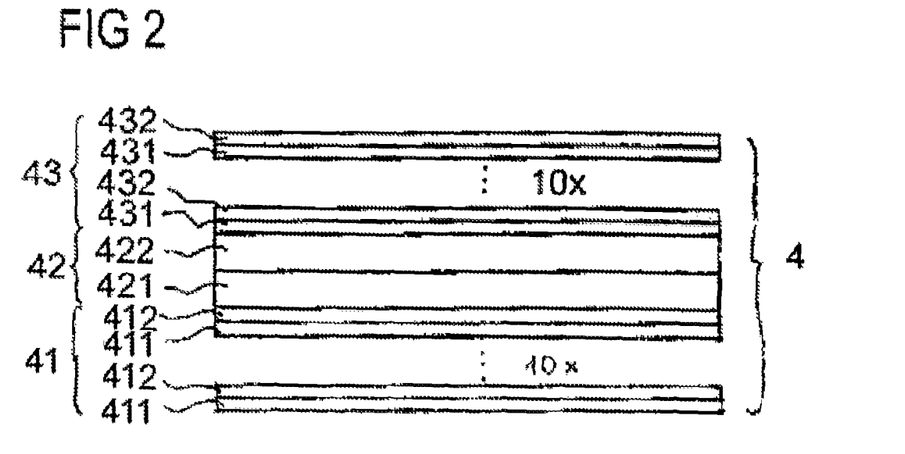
FIG. 2 shows a schematic cross section through the tunnel junction of the semiconductor body in accordance with the exemplary embodiment from FIG. 1.

As illustrated in FIG. 2, the tunnel junction 4 in the present case contains an n-type tunnel junction layer 41 and a p-type tunnel junction layer 43 succeeding the n-type tunnel junction layer 41 in the growth direction. The p-type tunnel junction layer 43 and/or the n-type tunnel junction layer 41 have a high doping in the case of the highly doped n-p tunnel junction 4.

The p-type tunnel junction layer 43 is embodied as a multilayer system in the present case. It contains a superlattice composed of alternating layers 431 and 432. In the present case, the superlattice contains ten pairs of layers 431, 432. By way of example, the superlattice contains highly p-doped InGaN layers 431 and undoped GaN layers 432, where InGaN denotes $In_xGa_{1-x}N$ where $0 \leq x \leq 1$.

The layer thickness of the individual layers of the superlattice 431, 432 is preferably 2 nm or less, particularly preferably 1 nm or less. In the present case, the layer thickness of the layers 431 and 432 is in each case 0.5 nm. The p-type tunnel junction layer 43 accordingly preferably has a thickness of 40 nm or less, particularly preferably of 20 nm or less. In the present case, the p-type tunnel junction layer 43 has a layer thickness of 10 nm.

In an analogous manner, the n-type tunnel junction layer 41 can also be constructed as a multilayer system. By way of example, in one configuration, the n-type tunnel junction layer 41 has a superlattice composed of alternating highly n-doped layers and undoped layers 411 and 412. By way of example, the n-doped layers are InGaN layers and the undoped layers are GaN layers. Particularly preferably, a short-periodic superlattice structure is involved, having a period of 10 nm or less, preferably of 5 nm or less, in particular of 2 nm or less. The layer thickness of the layers of the superlattice is 0.5 nanometer, for example. The number of periods is preferably less than or equal to 15.

The embodiment of the n-type tunnel junction layer 41 and/or of the p-type tunnel junction layer 43 as a superlattice has the advantage that the morphology of the crystal structure is thereby improved in comparison with a highly doped single layer. In particular, the multiplicity of interfaces contained in the superlattice structure reduces the propagation of dislocations in the semiconductor body.

In the case of the exemplary embodiment of the tunnel junction 4 as illustrated in FIG. 2, an undoped region 42 is arranged between the n-type tunnel junction layer 41 and the p-type tunnel junction layer 43. The undoped region 42 has the advantage that the n-type tunnel junction layer 41 and the p-type tunnel junction layer 43, which usually each have a high doping, do not directly adjoin one another. This counteracts a diffusion of the different charge carrier types into the respective highly doped layer having opposite doping and reduces a compensation of the charge carriers.

The undoped region 42 advantageously improves the electronic properties of the tunnel junction 4. In particular, a comparatively low forward voltage is obtained. By way of example, the forward voltage is 5 V of the semiconductor body or less.

The undoped region 42 preferably contains $Al_xGa_{1-x}N$ where $0 \leq x \leq 1$ or $Al_xIn_yGa_{1-x-y}N$ where $0 \leq x \leq 1$, $0 \leq y \leq 1$ and $x+y \leq 1$. $0.05 \leq x \leq 0.3$ preferably holds true for the aluminum component. An AlGaN layer is particularly well suited as a diffusion barrier if the p-type tunnel junction layer 43 contains magnesium as p-type dopant. The n-type dopant of the n-type tunnel junction layer 41 is silicon, for example.

The undoped region 42 preferably constitutes a multilayer structure having at least two undoped interlayers 421, 422. By way of example, the first undoped interlayer 421, which adjoins the n-type tunnel junction layer 41, is an undoped GaN layer. The latter has a thickness of approximately 2 nm, for example. In the present case, a second undoped interlayer 422 is arranged afterward in the growth direction, said interlayer adjoining the p-type tunnel junction layer 43. The second undoped interlayer 422 is an undoped AlGaN layer, for example. The latter has, for example, a layer thickness of approximately 1 nm to approximately 8 nm.

The two- or multilayered construction of the undoped region 42 advantageously makes it possible to adapt the undoped interlayers 421, 422 with regard to their material and their thickness to the diffusion properties of the dopant of the respectively adjoining tunnel junction layer 41, 43. By way of example, the AlGaN layer 422 is particularly well suited as a diffusion barrier for the p-type dopant or the p-type dopants of the p-type tunnel junction layer 43, in particular magnesium. The GaN layer 421 is particularly well suited as a diffusion barrier for the n-type dopant or the n-type dopants of the n-type tunnel junction layer 41, in particular silicon. In addition, the at least one additional interface in the case of the two- or multilayered construction of the undoped region 42 acts as an additional diffusion barrier for the dopants of the n-type and p-type tunnel junction layers 41, 43.

In one embodiment, the undoped region 42 has one or a plurality of p-doped interlayers 422 in addition to an undoped interlayer 421. In one advantageous configuration, the p-doped interlayer 422 or at least one p-doped interlayer 422 is arranged between two undoped interlayers 421. In this embodiment, the position of the tunnel junction can be set particularly precisely.

A p-doped confinement layer 5 is arranged in a manner succeeding the tunnel junction 4 in the growth direction. By way of example, the p-doped confinement layer constitutes a charge carrier confinement layer and/or a cladding layer. In one configuration, the p-doped confinement layer 5 is a p-doped $Al_xGa_{1-x}N$ layer where $0 \leq x \leq 0.1$. The layer thickness of the p-doped confinement layer 5 is between 50 and 500 nm, for example; it is preferably approximately 100 nm. In one preferred configuration, it is p-doped with magnesium as p-type dopant; by way of example, the p-type dopant is present in a concentration of between $10^{18}$ $cm^{-3}$ and $5 \times 10^{20}$ $cm^{-3}$ inclusive, preferably between $2 \times 10^{19}$ $cm^{-3}$ and $2 \times 10^{20}$ $cm^{-3}$ inclusive.

The active zone 7 is arranged in a manner succeeding the p-doped confinement layer 5 in the growth direction. In one advantageous development, a diffusion barrier 6 is arranged between the p-doped confinement layer 5 and the active zone 7. The diffusion barrier 6 advantageously reduces the risk of the p-type dopant of the p-doped confinement layer 5 penetrating into the active zone 7.

Figure 3:
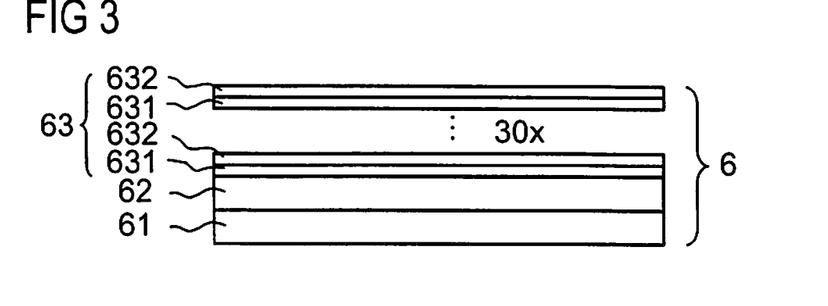
FIG. 3 shows a schematic cross section through the diffusion barrier of the semiconductor body in accordance with the exemplary embodiment from FIG. 1.

FIG. 3 illustrates an advantageous exemplary embodiment of the diffusion barrier 6. In accordance with the exemplary embodiment in FIG. 3, the diffusion barrier 6 is a layer sequence composed of a plurality of diffusion barrier layers 61, 62, 63.

The first diffusion barrier layer 61, which is adjacent to the substrate 1, is, for example, an undoped layer, in particular composed of AlGaN, which preferably has a layer thickness of 10 nm or less, for example, of 5 nm.

The first diffusion barrier layer 61 is succeeded in the growth direction by a second diffusion barrier layer 62, which is preferably likewise undoped and, in particular, is based on GaN. The layer thickness of the second diffusion barrier layer is approximately 20 nm, for example.

As a third diffusion barrier layer 63, which succeeds the second diffusion barrier layer 62 in the growth direction, the diffusion barrier 6 has a superlattice composed of alternating first and second layers 631, 632. By way of example, layers having different material compositions are involved, for instance alternating InGaN layers 631 and GaN layers 632. The superlattice has preferably 10 layer pairs 631, 632 or more; it preferably has 30 pairs or more of first and second layers 631 and 632.

In the present case, the indium proportion of the InGaN layers 631 decreases continuously or in steps in the growth direction. The layer thickness of the first and/or second layers 631, 632 is preferably less than or equal to 2 nm, particularly preferably less than or equal to 1 nm. In the present case, the first and second layers 631, 632 each have a layer thickness of 0.5 nanometer. The total thickness of the third barrier layer 63 is preferably between 2 nm and 100 nm inclusive, and in the present case is 30 nm.

The active zone 7 constitutes a multi-quantum well structure. It includes a plurality of active layers 71, between which a barrier layer 72 is in each case arranged. A respective further barrier layer 72A precedes the first active layer 71 and succeeds the last active layer 71 in the growth direction.

The active layers 71 contain, for example, InGaN or consist thereof. The layer thickness of the active layers 71 is, for example, greater than or equal to 0.8 nm, and, in particular, less than or equal to 10 nm; the layer thickness preferably has a value of between 1.8 nm and 5 nm inclusive.

The barrier layers 72 contain, for example, AlInGaN or consist thereof. They have, in particular, a layer thickness of between 1 nm and 20 nm, preferably between 2 and 12 nm, in each case inclusive of the limits. The barrier layers 72 are preferably GaN layers. In particular, barrier layers 72 which are GaN layers preferably have a layer thickness of less than or equal to 7 nm, particularly preferably of less than or equal to 4 nm.

An undoped semiconductor layer constituting, in particular, an n-conducting confinement layer 8, for example, an undoped GaN layer, is arranged in a manner succeeding the active zone 7. The undoped semiconductor layer has, for example, a layer thickness of between 3 nm and 40 nm, in particular, between 3 nm and 15 nm, in each case inclusive of the limits.

A further n-type contact layer 9 succeeds the n-conducting confinement layer 8 at the top side of the semiconductor body remote from the substrate 1. The further n-type contact layer 9 is, for example, a layer sequence composed of an n-doped GaN layer facing the active zone 7 and having, for example, a layer thickness of approximately 120 nm, and an n-doped, in particular, highly n-doped, InGaN layer remote from the active zone and having, for example, a layer thickness of approximately 5 nm. By way of example, the n-doped GaN layer is doped with Si in a concentration of between $10^{18}$ $cm^{-3}$ and $6 \times 10^{19}$ $cm^{-3}$, inclusive, preferably between $2 \times 10^{18}$ $cm^{-3}$ and $8 \times 10^{18}$ $cm^{-3}$ inclusive. The n-doped InGaN layer is doped, for example, with Si in a concentration of between $10^{18}$ $cm^{-3}$ and $10^{21}$ $cm^{-3}$ inclusive, preferably in a concentration of greater than or equal to $3 \times 10^{19}$ $cm^{-3}$.

The semiconductor body, which is, in particular, a light emitting diode chip (LED chip), or a laser diode chip, therefore has n-type contact layers 3, 9 on both sides. Electrical contact is made with the semiconductor body, for example, at a side of the substrate 1 which is remote from the semiconductor layer sequence and at the surface of the further n-type contact layer 9. For this purpose, for example, the further n-type contact layer 9 has applied to it a contact metallization, which is patterned, in particular, and/or a transparent conductive layer, for example composed of a transparent conductive oxide such as indium tin oxide (ITO) or ZnO.

Figure 5A:
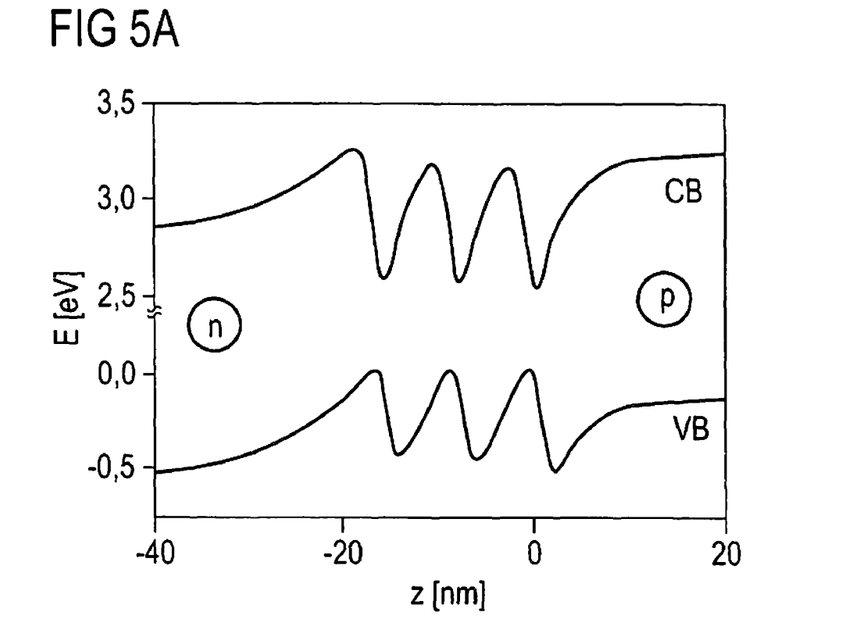
FIG. 5A shows a schematic illustration of the band structure of a conventional multi-quantum well structure.
Figure 5B:
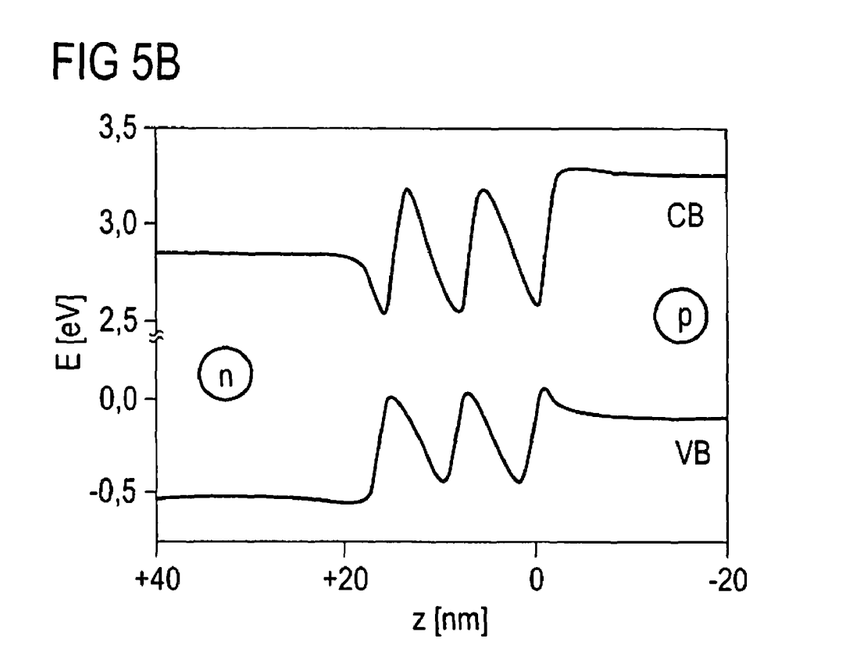
FIG. 5B shows a schematic illustration of the multi-quantum well structure in accordance with the exemplary embodiment from FIG. 1.

FIG. 5B illustrates an energy level scheme of the multi-quantum well structure 7 of the semiconductor body in accordance with the exemplary embodiment from FIG. 1 with a tunnel junction 4 in accordance with FIG. 2 and a diffusion barrier 6 in accordance with FIG. 3. FIG. 5A shows, in comparison therewith, the same quantum well structure in a semiconductor body without a tunnel junction. The energy E of valence band VB and conduction band CB is plotted along the vertical axes of the figures in electron-volts (eV).

The horizontal axis specifies in each case the relative position z within the semiconductor layer sequence in nanometers (nm). The value of the position z increases with the distance from the substrate 1. In the case of the quantum well structure in FIG. 5A, therefore, the growth substrate is arranged on the n side. The n side is marked with the letter n in the figure and arranged to the left of the quantum well structure. In FIG. 5B, the growth substrate is arranged on the p side marked with the letter p—on the right in the figure.

In the case of the semiconductor body without a tunnel junction, the charge carriers have to overcome high energetic potential barriers upon transition from the n-conducting confinement layer into the active zone and from the p-doped confinement layer into the active zone. The barriers correspond to the great rises approximately at the positions −20 nanometers and +5 nanometers in FIG. 5A. Such potential barriers do not occur or scarcely occur in the case of the semiconductor body comprising the tunnel junction 4.

A comparison of FIGS. 5A and 5B additionally shows that in the case of the active zone in the semiconductor body comprising a tunnel junction 4 (FIG. 5B), the depth of the quantum wells is slightly reduced and their form differs significantly from the form of the quantum wells in accordance with FIG. 5A. In this way, the effective thickness of the potential barriers between the quantum wells is reduced in the case of the active zone 7 in the semiconductor body comprising a tunnel junction 4. Thus, tunneling of charge carriers between the quantum wells is facilitated and a more homogenous distribution of the charge carriers along the individual quantum wells is obtained.

By means of calculating the electron density it was possible to show that in the case of the semiconductor body without a tunnel junction as illustrated in FIG. 5A, the highest electron density occurs in the vicinity of the interface between the active zone and the p-doped confinement layer, corresponding approximately to the position 0 nm in FIG. 5A. This permits electrons to recombine non-radiatively on the p side.

In the case of the semiconductor body in accordance with FIG. 5B, by contrast, the electron concentration is highest in the vicinity of the interface between the active zone 7 and the n-conducting confinement layer 8, corresponding to a position between approximately 15 and 20 nm in FIG. 5B. The risk of a non-radiative recombination of electrons is thereby advantageously reduced, which has an advantageous effect on the efficiency of the semiconductor body particularly at high operating currents, and thus, in particular, at high charge carrier concentrations.

Figure 6:
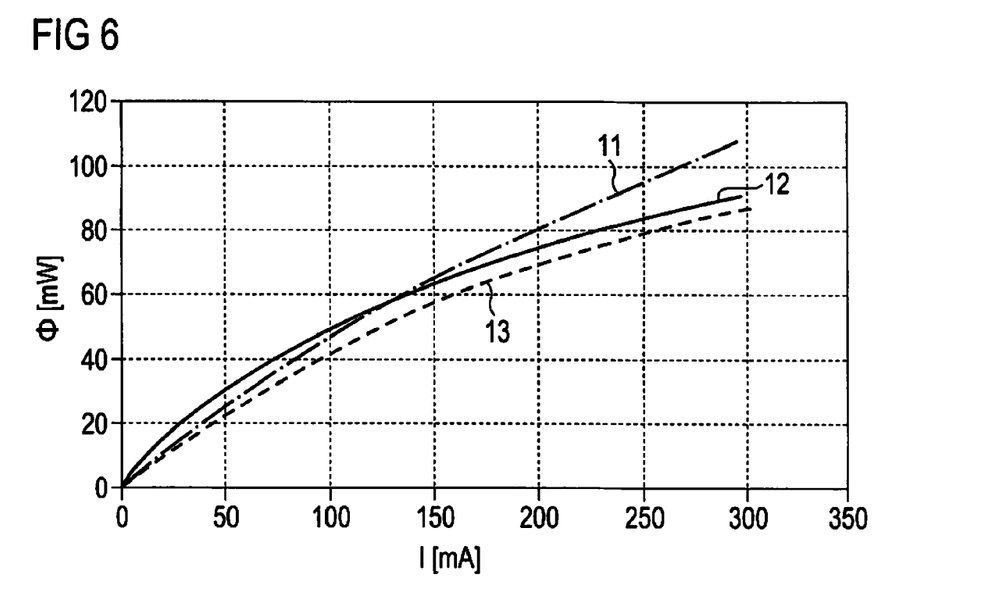
FIG. 6 shows the dependence of the emitted radiant power on the operating current in the case of the semiconductor body in accordance with the exemplary embodiment from FIG. 1 in comparison with further semiconductor bodies.

FIG. 6 illustrates the radiant power Φ of the light emitted by various semiconductor bodies as a function of the respective operating current I.

Curve 11 shows the radiant power Φ of the semiconductor body in accordance with the exemplary embodiment from FIG. 1 as a function of the operating current I. In comparison therewith, the radiant powers Φ are illustrated as a function of the operating current I for a semiconductor body comprising a multi-quantum well structure but without a tunnel junction, curve 12, and for a semiconductor body comprising a tunnel junction and a single quantum well structure, curve 13. In the case of the present semiconductor bodies, an operating current I of 100 mA essentially corresponds to an operating current density of 200 A/cm$^2$. The range from 0 to 350 mA as illustrated in FIG. 6 thus corresponds to an operating current density range from 0 to approximately 700 A/cm$^2$.

Neither the semiconductor body comprising a multi-quantum well structure but without a tunnel junction nor the semiconductor body comprising a tunnel junction and a single quantum well structure achieves the efficiency of the semiconductor body according to the invention at operating currents I above approximately b 150 mA.

While a strong saturation occurs in the case of the lines 12 and 13, the line 11, associated with the exemplary embodiment in accordance with FIG. 1, has a virtually linear profile at high operating currents I.

It also emerges from FIG. 6, in particular, on account of the almost identical profile of curves 12 and 13, that, in the case of the semiconductor body without a tunnel junction and comprising a multi-quantum well structure, only one of the quantum wells of the multi-quantum well structure contributes to the emission.

Only the combination of barrier layers 72 having small layer thicknesses, the reduction of the potential barriers in the multi-quantum well structure through the use of a tunnel junction 4 in the semiconductor body and the distribution of the radiation emission among a plurality of quantum wells 71 with a uniform distribution of the charge carriers among the active layers 71 leads to an increased efficiency of the emission intensity at high current densities.

Figure 7:
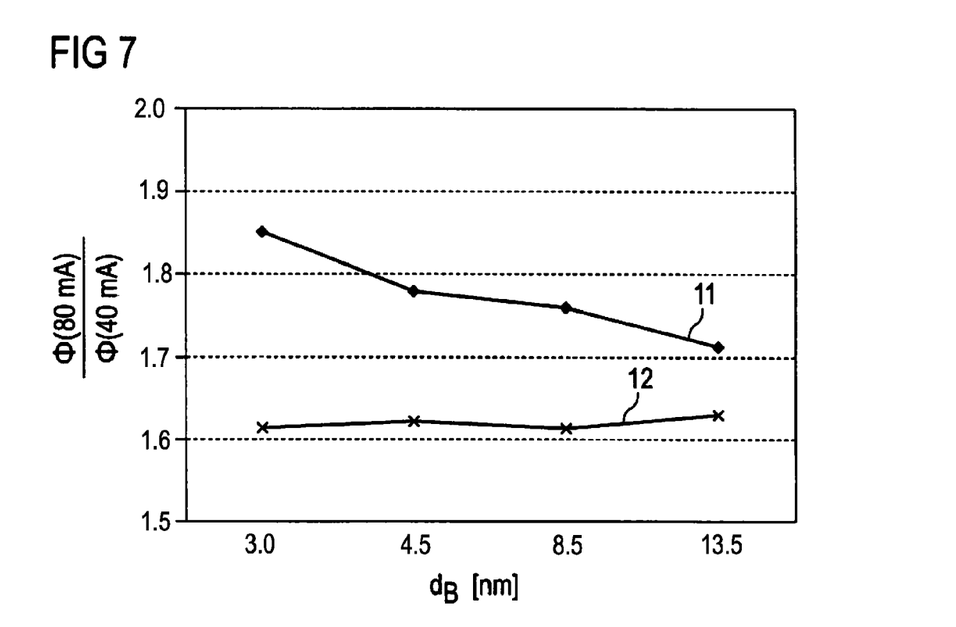
FIG. 7 shows a schematic illustration of the linearity of the emitted radiant power as a function of the layer thickness of the barrier layer in the case of the semiconductor body in accordance with the exemplary embodiment from FIG. 1 in comparison with a further semiconductor body.

FIG. 7 shows that a substantially linear profile of the radiant power Φ of the light emitted by the semiconductor body as a function of the operating current intensity I is actually achieved only with a sufficiently small layer thickness of the barrier layers 72.

In the case of the semiconductor body comprising a multi-quantum well structure without a tunnel junction, the layer thickness $d_B$ of the barrier layers is practically unimportant (curve 12). The ratio of the radiant power at an operating current of 80 mA, Φ(80 mA), to the intensity at an operating current of 40 mA, Φ(40 mA), indicates a strong saturation with a value of approximately 1.6 for all layer thicknesses $d_B$.

By contrast, in the case of the semiconductor body in accordance with the exemplary embodiment from FIGS. 1 and 5B, the ratio of the radiant powers, Φ(80 mA)/Φ(40 mA), rises greatly as the layer thickness $d_B$ of the barrier layers 72 decreases. The ratio of approximately 1.8 or more in the case of layer thicknesses $d_B$ of the barrier layers 72 of 4 nm or less, such as are realized in the present exemplary embodiment, indicates an improved linearity and hence a higher efficiency of the emission intensity of the semiconductor body at high operating currents I.

Figure 10:
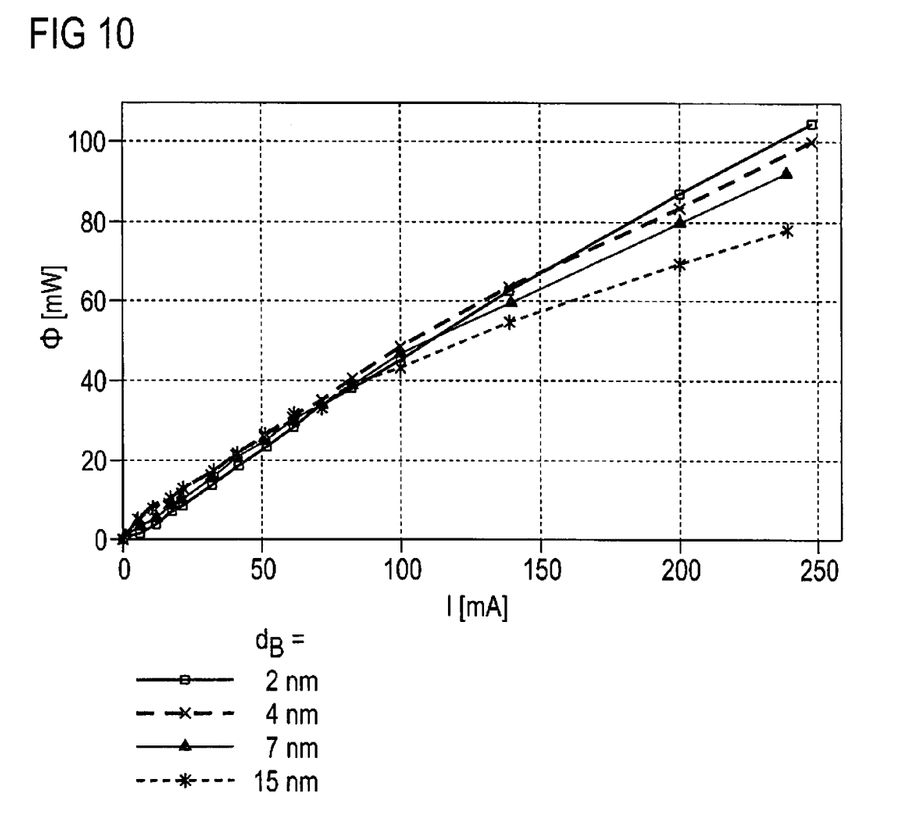
FIG. 10 shows the dependence of the intensity of the electromagnetic radiation emitted by the semiconductor body in accordance with the exemplary embodiment from FIG. 1 on the operating current for various layer thicknesses of the barrier layer.

This is illustrated once again in FIG. 10. This figure shows the dependence of the radiant power Φ on the operating current I for the semiconductor body in accordance with the exemplary embodiment from FIG. 1 comprising barrier layers 72 having layer thicknesses $d_B$ of 2 nm, 4 nm, 7 nm and 15 nm. The efficiency is increased at high operating currents I if the barrier layers 72 have a layer thickness $d_B$ of 7 nm or less, preferably of 4 nm or less, and in particular of 2 nm or less.

Figure 8:
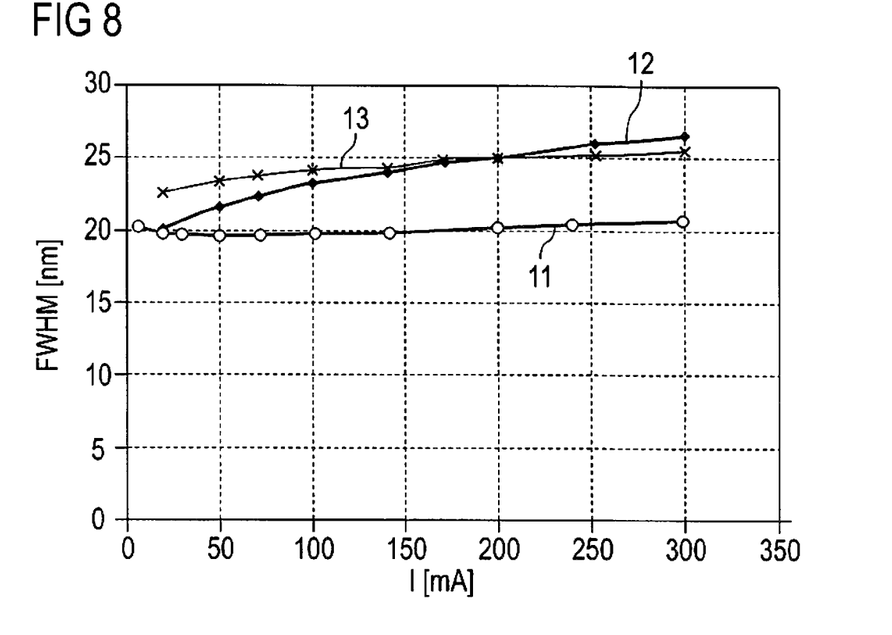
FIG. 8 shows the full width at half maximum of the spectral distribution as a function of the operating current in the case of the semiconductor body in accordance with the exemplary embodiment from FIG. 1 in comparison with further semiconductor bodies.

FIG. 8 shows the values for full width at half maximum FWHM of the electromagnetic radiation emitted by various semiconductor bodies. Like FIG. 6, curves 11, 12 and 13 are associated with a semiconductor body in accordance with the exemplary embodiment from FIG. 1 (curve 11) a semiconductor body comprising a multi-quantum well structure but without a tunnel junction (curve 12) and a semiconductor body comprising a tunnel junction and a single quantum well structure (curve 13).

In contrast to the values for full width at half maximum FWHM of the radiation of the other semiconductor bodies, the full width at half maximum FWHM of the radiation of the semiconductor body in accordance with the exemplary embodiment from FIG. 1 is practically independent of the operating current I. The semiconductor body in accordance with one of the configurations described above is therefore particularly well suited for a high-power laser diode.

Figure 9:
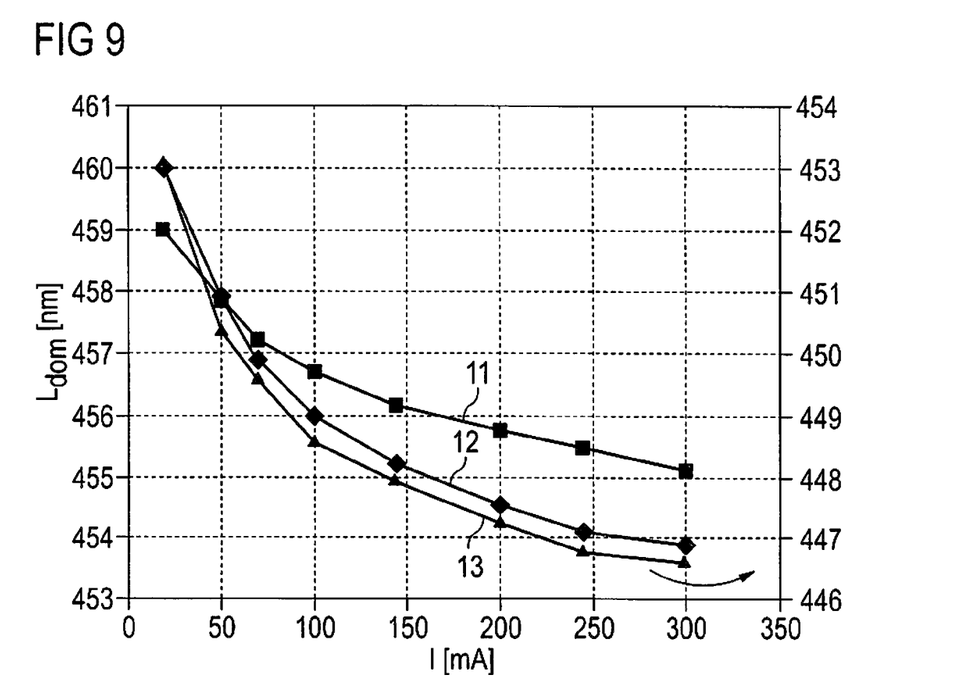
FIG. 9 shows the wavelength of the emission maximum as a function of the operating current in the case of the semiconductor body in accordance with the exemplary embodiment from FIG. 1 in comparison with further semiconductor bodies.

FIG. 9 shows the dependence of the wavelength $L_{dom}$ of the intensity maximum of the radiation emitted by various semiconductor bodies on the operating current I. While the wavelength $L_{dom}$ is shifted greatly with the operating current I in the case of the semiconductor body comprising a multi-quantum well structure but without a tunnel junction (curve 12) and in the case of the semiconductor body comprising a tunnel junction and a single quantum well structure (curve 13), the change in the wavelength $L_{dom}$ of the intensity maximum with the operating current I in the case of the semiconductor body in accordance with the exemplary embodiment from FIG. 1 (curve 11) is advantageously less pronounced.

Figure 11:
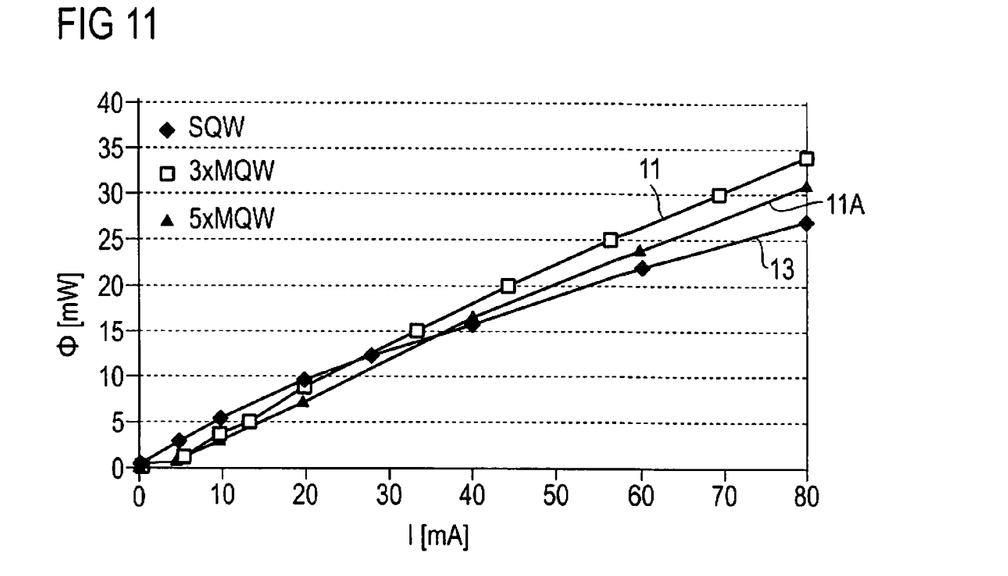
FIG. 11 shows the dependence of the radiant power of the electromagnetic radiation emitted by the semiconductor body in accordance with the exemplary embodiment from FIG. 1 on the operating current for various numbers of active layers.

It can be seen from FIG. 11 that the efficiency of the semiconductor body at high operating currents I is dependent on the number of quantum wells of the quantum well structure. Given a layer thickness $d_B$ of the barrier layer 72 of 4 nm, as in the case of the semiconductor body in accordance with the exemplary embodiment from FIG. 1, an active zone 7 with a multi-quantum well structure having precisely three active layers 71 is particularly efficient. The radiant power $\Phi$ of the electromagnetic radiation emitted by this semiconductor body at operating currents I above approximately 40 mA is maximal (curve 11) in the case of a multi-quantum well structure having three multiple quantum wells ("3×MQW").

A further increase in the number of active layers 71 does not bring about further improvement of the radiant power $\Phi$ of the emitted radiation. By way of example, the radiant power $\Phi$ of the semiconductor body comprising a multi-quantum well structure having five active layers 71 ("5× MQW", curve 11A) is even somewhat lower than that of the semiconductor body comprising a multi-quantum well structure having three active layers 71 (curve 11).

It is currently assumed by the inventors that this can be attributed to the fact that the width of the active zone is then greater than the width of the region in which the charge carriers can recombine. The increase in the number of quantum wells then does not lead to an increase in the number of active layers 71 that emit radiation during operation. Given a smaller layer thickness $d_B$ of the barrier layers 72, for example, a layer thickness of 2 nanometers or less, it may be expedient, however, to provide a multi-quantum well structure having more than three active layers 71, for example, having four or five active layers 71. The smaller extent of the active zone in the growth direction then has the consequence that in this case all four or five layers emit electromagnetic radiation during operation of the semiconductor body.

The semiconductor body comprising a single quantum well structure ("SQW") emits light having the lowest radiant power $\Phi$ (curve 13) at operating currents I above approximately 40 mA, which once again demonstrates that a plurality of the active layers 71 contribute to the radiation emission in the case of the semiconductor bodies comprising a multi-quantum well structure and a tunnel junction 4.

Figure 12:
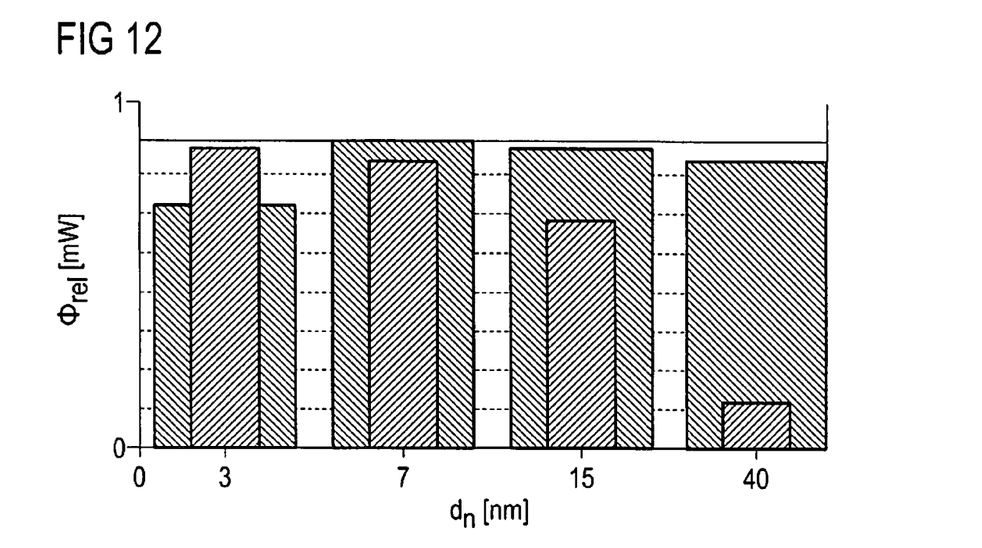
FIG. 12 shows the relative intensity of the emitted electromagnetic radiation as a function of the layer thickness of the undoped semiconductor layer in the case of the semiconductor body in accordance with the exemplary embodiment from FIG. 1 in comparison with a further semiconductor body.

FIG. 12 illustrates the dependence of the relative radiant power $\Phi_{rel}$ emitted during operation by the semiconductor body in accordance with the exemplary embodiment from FIG. 1 on the layer thickness $d_n$ of the undoped, n-conducting layer 8 (wide bars). In comparison therewith, the figures show the relative radiant power $\Phi_{rel}$ for a semiconductor body comprising a multi-quantum well structure and without a tunnel junction between the substrate and the active zone (narrow bars).

While in the case of the latter the radiant power $\Phi_{rel}$ of the emitted electromagnetic radiation decreases greatly as the layer thickness $d_n$ of the undoped n-conducting layer increases, the semiconductor body in accordance with the exemplary embodiment from FIG. 1 advantageously exhibits only a small dependence of the radiant power $\Phi_{rel}$ of the electromagnetic radiation emitted during operation on the layer thickness $d_n$ of the undoped, n-conducting layer.

Figure 4:
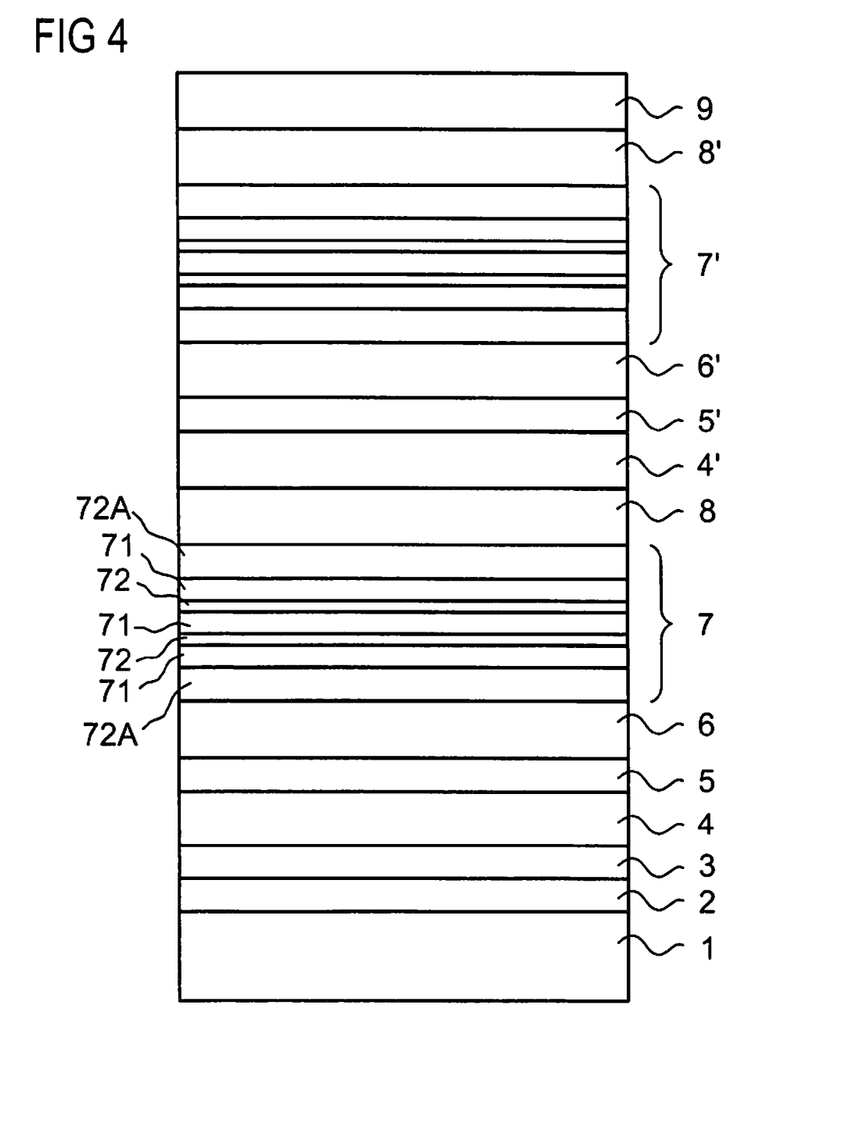
FIG. 4 shows a schematic cross section through a semiconductor body in accordance with a further exemplary embodiment.

FIG. 4 shows a further exemplary embodiment of a semiconductor body. In accordance with this exemplary embodiment, the semiconductor body contains between the n-conducting confinement layer 8 and the n-type contact layer 9 a further tunnel junction 4', a further p-doped confinement layer 5', a further diffusion barrier 6', a further active zone 7' and a further n-conducting confinement layer 8', which succeed one another in this order in the direction from the n-conducting confinement layer 8 to the n-type contact layer 9.

In the present case, the further tunnel junction 4', the further p-doped confinement layer 5', the further diffusion barrier 6', the further active zone 7' and the further n-conducting confinement layer 8' are embodied identically to the tunnel junction 4, the p-doped confinement layer 5, the diffusion barrier 6, the active zone 7 and the n-conducting confinement layer 8. The embodiment of the individual layer corresponds, for example, to the configurations described in connection with the exemplary embodiment from FIGS. 1 to 3.

The invention is not restricted to the exemplary embodiments by the descriptions on the basis thereof. Rather, it encompasses any novel feature and also any combination of features, which, in particular, includes any combination of features in the patent claims, even if this feature or this combination itself is not explicitly specified in the patent claims or exemplary embodiments.

The invention claimed is:

1. A radiation-emitting semiconductor body comprising:
a contact layer;
an active zone;
a tunnel junction arranged between the contact layer and the active zone, wherein the tunnel junction comprises at least one n-type tunnel junction layer and at least one p-type tunnel junction layer; and
an undoped region comprising at least one undoped interlayer contained between the at least one n-type tunnel junction layer and the at least one p-type tunnel junction layer, wherein the undoped region comprises at least two interlayers having different compositions;
wherein the active zone has a multi-quantum well structure containing at least two active layers that emit electromagnetic radiation when an operating current is impressed into the semiconductor body.

2. The semiconductor body as claimed in claim 1, further comprising a barrier layer having a layer thickness of less than or equal to 9 nm arranged between two active layers of the at least two active layers.

3. The semiconductor body as claimed claim 1, wherein the active zone comprises three to five active layers.

4. The semiconductor body as claimed in claim 1, wherein at least the active zone is based on a nitride-III compound semiconductor material.

5. The semiconductor body as claimed in claim 1, wherein the contact layer comprises an n-type contact layer.

6. The semiconductor body as claimed in claim 1 claim 7, wherein at least the following semiconductor layers succeed one another in the specified order in a growth direction:
   an n-type contact layer,
   the tunnel junction, wherein the at least one p-type tunnel junction layer succeeds the undoped region and the latter succeeds the at least one n-type tunnel junction layer in the growth direction,
   a p-doped confinement layer,
   the active zone, and
   a further n-type contact layer.

7. The semiconductor body as claimed in claim 1, wherein the at least one n-type tunnel junction layer and/or the at least one p-type tunnel junction layer contains a superlattice composed of alternating layers having different material compositions and/or dopant concentrations.

8. The semiconductor body as claimed in claim 1, further comprising an undoped interlayer having a layer thickness of between 3 and 40 nm on that side of the active zone which is remote from the tunnel junction.

9. The semiconductor body as claimed in claim 1, wherein, during operation with an operating current, the semiconductor body emits electromagnetic radiation having a spectral distribution with an intensity maximum, wherein a full width at half maximum of the spectral distribution is substantially independent of a current intensity of the operating current.

10. The semiconductor body as claimed in claim 1, further comprising a further tunnel junction and a further active zone which succeed the active zone in a growth direction.

11. The semiconductor body as claimed in claim 1, further comprising:
   a p-doped confinement layer; and
   a diffusion barrier for a p-type dopant of the p-doped confinement layer arranged between the p-doped confinement layer and the active zone.

12. The semiconductor body as claimed in claim 11, wherein the diffusion barrier contains a superlattice.

13. The semiconductor body as claimed in claim 1, wherein the semiconductor body is configured to operate with an operating current density of greater than or equal to 100 A/cm$^2$.

14. The semiconductor body as claimed in claim 13, wherein the semiconductor body can operate with an operating current density of greater than or equal to 200 A/cm$^2$.

* * * * *

UNITED STATES PATENT AND TRADEMARK OFFICE
CERTIFICATE OF CORRECTION

| | |
|---|---|
| PATENT NO. | : 8,314,415 B2 |
| APPLICATION NO. | : 12/668386 |
| DATED | : November 20, 2012 |
| INVENTOR(S) | : Strassburg et al. |

Page 1 of 1

It is certified that error appears in the above-identified patent and that said Letters Patent is hereby corrected as shown below:

IN THE CLAIMS

In Col. 15, line 1, claim 6, delete "claim 7".

Signed and Sealed this
Sixteenth Day of April, 2013

Teresa Stanek Rea
*Acting Director of the United States Patent and Trademark Office*